US012261971B2

(12) United States Patent
Hu et al.

(10) Patent No.: US 12,261,971 B2
(45) Date of Patent: Mar. 25, 2025

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Peng Hu, Hubei (CN); Yanqiang Duan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/593,889

(22) PCT Filed: Aug. 3, 2021

(86) PCT No.: PCT/CN2021/110272
§ 371 (c)(1),
(2) Date: Jan. 5, 2023

(87) PCT Pub. No.: WO2023/272868
PCT Pub. Date: Jan. 5, 2023

(65) Prior Publication Data
US 2024/0048647 A1 Feb. 8, 2024

(30) Foreign Application Priority Data
Jun. 28, 2021 (CN) .......................... 202110717972.2

(51) Int. Cl.
*H04M 1/02* (2006.01)
*H01L 23/544* (2006.01)
(Continued)

(52) U.S. Cl.
CPC ........ *H04M 1/0269* (2022.02); *H01L 23/544* (2013.01); *H10K 59/131* (2023.02); *H10K 59/8792* (2023.02); *H01L 2223/54426* (2013.01)

(58) Field of Classification Search
CPC ............... H04M 1/0269; H01L 23/544; H01L 2223/54426; H10K 59/131;
(Continued)

(56) References Cited
U.S. PATENT DOCUMENTS
2014/0139445 A1  5/2014  Chen et al.
2015/0060782 A1* 3/2015  Li ........................ H05K 1/0269
                                                                    174/254
(Continued)

FOREIGN PATENT DOCUMENTS
CN   107705709 A   2/2018
CN   108962024 A   12/2018
(Continued)

*Primary Examiner* — Donald L Raleigh (57) ABSTRACT

A display device, and the display device includes a display panel is provided. The display panel includes a planar area, a first bending area, and a second bending area. The planar area includes a main display area and a peripheral area. The peripheral area includes a first peripheral area. The first peripheral area is located at a corner of the main display area, and the first peripheral area is located between the first bending area and the second bending area. A first alignment mark is provided in the first peripheral area.

20 Claims, 8 Drawing Sheets

(51) Int. Cl.
*H10K 59/131* (2023.01)
*H10K 59/80* (2023.01)

(58) Field of Classification Search
CPC ........... H10K 59/8792; H10K 59/1201; H10K 77/111; H10K 2102/311; H10K 59/12; Y02E 10/549
See application file for complete search history.

(56) References Cited

U.S. PATENT DOCUMENTS

| | | | |
|---|---|---|---|
| 2018/0019417 A1 | 1/2018 | Andou | |
| 2021/0351262 A1* | 11/2021 | Kim | H10K 59/88 |
| 2021/0378107 A1* | 12/2021 | Hwang | H05K 7/20954 |
| 2022/0384541 A1* | 12/2022 | Cheng | H10K 59/124 |

FOREIGN PATENT DOCUMENTS

| | | | |
|---|---|---|---|
| CN | 111029290 A | 4/2020 | |
| CN | 111244135 A | 6/2020 | |
| CN | 111383537 A | 7/2020 | |
| CN | 111564113 A | 8/2020 | |
| CN | 112116879 A | 12/2020 | |
| KR | 20160045323 A | 4/2016 | |
| WO | 2021120216 A1 | 6/2021 | |

\* cited by examiner

DISPLAY DEVICE

FIELD OF INVENTION

The present disclosure relates to the technical field of display, and particularly, to a display device.

BACKGROUND OF INVENTION

With the diversification of market demand, four-curved full-screen mobile phones came into being. In the pad bending process of the four-curved full-screen mobile phone, it is necessary to use a charge coupled device (CCD) camera to simultaneously capture an alignment mark on the display panel and an alignment mark of a binding part. The relative positional relationship between such a group of the alignment marks determines whether a predetermined bending position is reached. Since the alignment mark on the display panel is in a curved surface display area, the alignment mark on the display panel is distorted and cannot be captured under a normal viewing angle due to the alignment mark entering an arc area when bending. The bending process is difficult to progress, which brings difficulties to the manufacture of display devices.

Technical Problems

In view of this, the purpose of the present disclosure is to provide a display device which can solve a technical problem that the alignment mark on a curved surface display area is distorted and cannot be captured.

SUMMARY OF INVENTION

The present disclosure provides a display device, and the display device comprises a display panel. The display panel comprises:
- a planar area comprising a first edge and a second edge, wherein the first edge is adjacent to the second edge, the planar area comprises a main display area and a peripheral area, and the peripheral area is located at a corner of the main display area;
- a first bending area connected to the first edge, wherein the first bending area comprises a binding part, and the binding part is bent to a back of the display panel; and
- a second bending area connected to the second edge;
- wherein the peripheral area comprises a first peripheral area, the first peripheral area is located at the corner of the main display area, and the first peripheral area is located between the first bending area and the second bending area, a first alignment mark is provided in the first peripheral area, and the first alignment mark is configured for alignment of the binding part upon bending.

In one embodiment, an intersection point of the first edge and the second edge is located outside the planar area.

In one embodiment, outer peripheries of the first bending area, the first peripheral area, and the second bending area are connected to each other to form a rounded corner.

In one embodiment, the intersection point of the first edge and the second edge is in the planar area.

In one embodiment, an opening is provided at an intersection point of the first bending area and the second bending area.

In one embodiment, the first alignment mark is located on one edge of the first peripheral area away from the main display area.

In one embodiment, the display panel comprises a substrate and a metal layer. The metal layer is disposed on the substrate. The metal layer comprises the first alignment mark, and a light transmission part is provided between the first alignment mark and the substrate.

In one embodiment, the display device comprises:
- the substrate;
- a driving circuit layer disposed on the substrate, wherein the driving circuit layer comprises a gate metal layer; and
- a light emitting layer disposed on one edge of the driving circuit layer away from the substrate, and the light emitting layer comprises a metal electrode layer;
- wherein the metal layer is one of the gate metal layer and the metal electrode layer.

In one embodiment, the display panel further comprises a plurality of signal wiring lines. The plurality of signal wiring lines are in the first peripheral area. The first peripheral area comprises a clearance area. The plurality of signal wiring lines are arranged around the clearance area, and the first alignment mark is in the clearance area.

In one embodiment, an outer periphery of the first peripheral area has a cutting path. The first peripheral area comprises a retaining wall. The retaining wall is located on one edge of the cutting path close to the main display area. The first alignment mark is located between the retaining wall and the cutting path.

In one embodiment, the main display area further comprises a third edge. The third edge is opposite the second edge and adjacent to the first edge. The display panel further comprises a third bending area. The third bending area is connected to the third edge. The peripheral area comprises a second peripheral area. The second peripheral area is located at the corner of the main display area, and the second peripheral area is located between the first bending area and the third bending area. A second alignment mark is provided in the second peripheral area, and the second alignment mark is configured for alignment of the binding part upon bending.

In one embodiment, the first alignment mark and the second alignment mark are disposed in the same layer or disposed in different layers.

In one embodiment, the display panel further comprises a third alignment mark. The third alignment mark is located at one end of the binding part close to the first alignment mark.

In one embodiment, a linear distance between the first alignment mark and the third alignment mark is within a range of 3 mm±0.2 mm.

In one embodiment, the display panel further comprises a fourth alignment mark. The fourth alignment mark is located at one end of the binding part close to the second alignment mark.

In one embodiment, a linear distance between the second alignment mark and the fourth alignment mark is within a range of 3 mm±0.2 mm.

In one embodiment, the display device further comprises a cover plate.

The cover plate is disposed on one edge of the display panel. A light shielding layer is provided on one edge of the cover plate close to the display panel. The light shielding layer is disposed corresponding to the first alignment mark.

In one embodiment, the first alignment mark is a "T" shape, a "cross" shape or a "L" shape.

Beneficial Effects

The present disclosure provides a display device. The application provides a display device. The display device comprises a display panel. The display panel comprises a planar area, a first bending area, and a second bending area. The planar area comprises a first edge and a second edge. The first edge is adjacent to the second edge. The planar area comprises a main display area and a peripheral area. The peripheral area is located at a corner of the main display area. The first bending area is connected to the first edge. The first bending area comprises a binding part. The binding part is bent to a back of the display panel. The second bending area is connected to the second edge. The peripheral area comprises a first peripheral area. The first peripheral area is located at the corner of the main display area, and the first peripheral area is located between the first bending area and the second bending area. A first alignment mark is disposed in the first peripheral area. The first alignment mark is configured for alignment of the binding part upon bending. The first alignment mark of the present disclosure configured for alignment of the binding part upon bending is disposed in the planar area. When the binding part is bent, distortion will not occur, the first alignment mark is easy to be captured by a CCD camera and to be identified. In addition, the first alignment mark is disposed in a non-display area of the planar area, which does not affect a pixel arrangement of the main display area, is not interfered by a reflective metal of the main display area and is easy to be identified.

BRIEF DESCRIPTION OF DRAWINGS

In order to explain the technical solutions of the present disclosure more clearly, the following will briefly introduce the drawings needed in the description of the embodiments. Obviously, the drawings in the following description are merely some embodiments of the present disclosure. For those skilled in the art, without creative work, other drawings can be obtained based on these drawings.

FIG. 5 (*a*) is a schematic partial cross-sectional view of the display panel according to one embodiment of the present disclosure.

FIG. 5 (*b*) is a schematic partial cross-sectional view of the display panel according to another embodiment of the present disclosure.

FIG. 5 (*c*) is a schematic partial cross-sectional view of the display panel according to yet another embodiment of the present disclosure.

DETAILED DESCRIPTION OF PREFERRED EMBODIMENTS

The following will clearly and completely describe the technical solutions in the embodiments of the present disclosure with reference to the drawings in the embodiments of the present disclosure. Obviously, the described embodiments are only one portion of the embodiments of the present disclosure, rather than all of the embodiments. Based on the embodiments in the present disclosure, all other embodiments obtained by those skilled in the art without creative work are within claimed scope of the present disclosure.

In the present disclosure, unless clearly stipulated and defined otherwise, a first feature "above" or "below" a second feature may comprise direct contact between the first feature and second feature or may also comprise indirect contact between the first feature and second feature but through other features between them. Moreover, the first feature "above", "on", and "over" the second feature comprise the first feature directly above and obliquely above the second feature, or it simply means that a level of the first feature is higher than a level of the second feature. The first feature "below", "beneath" and "under" of the second feature comprise the first feature directly below and obliquely below the second feature, or it simply means that the level of the first feature is lower than the level of the second feature.

The present disclosure provides a display device. The display device of the embodiment of the present disclosure may be a mobile phone, a tablet computer, a desktop computer, a laptop computer, an e-reader, a handheld computer, an electronic display screen, a notebook computer, an ultra-mobile personal computer (UMPC), netbooks, as well as a cellular phone, a personal digital assistant (PDA), an augmented reality (AR)\virtual reality (VR) device, a media player, a wearable device, a digital camera, a car navigation, etc. Specifically, in the embodiment of the present disclosure, a mobile phone is taken as an example of the display device for illustration.

Figure 1:
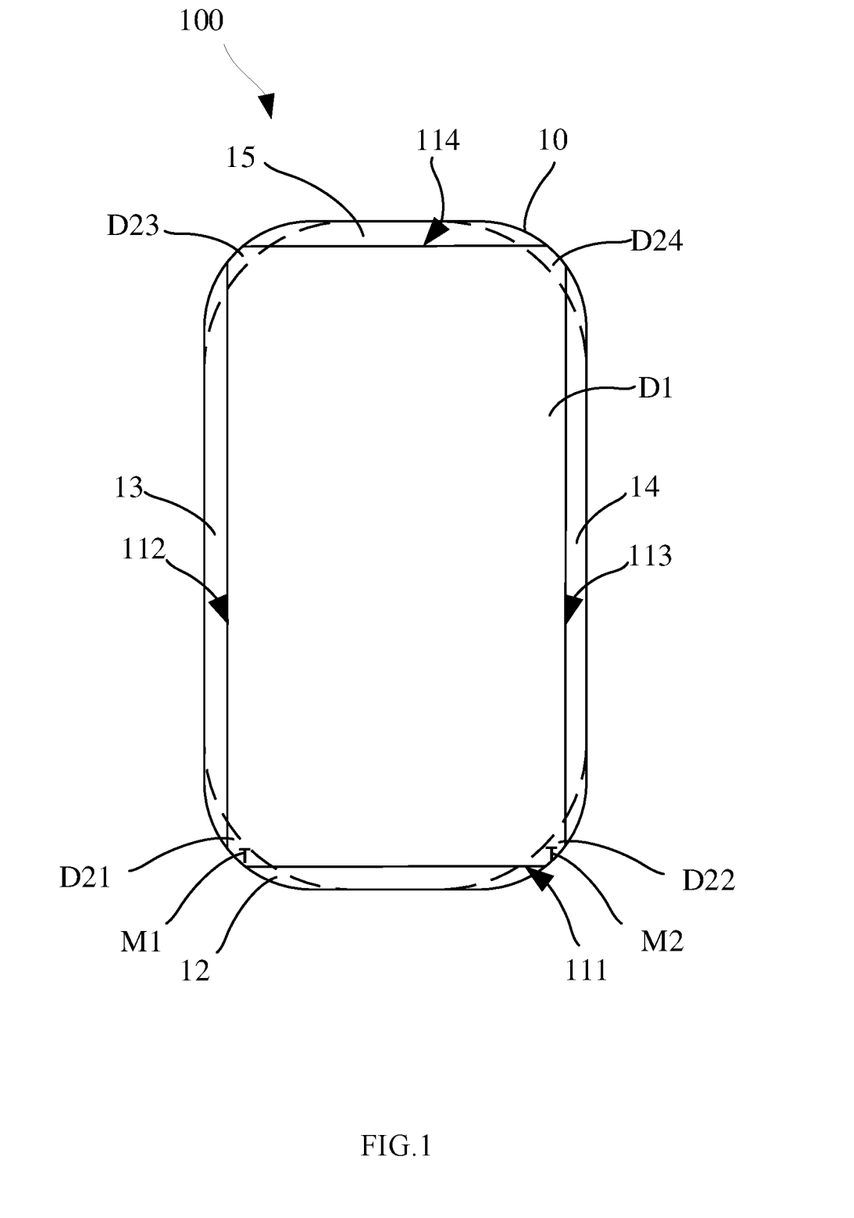
FIG. 1 is a schematic top view of the display device according to a first embodiment of the present disclosure.
Figure 2:
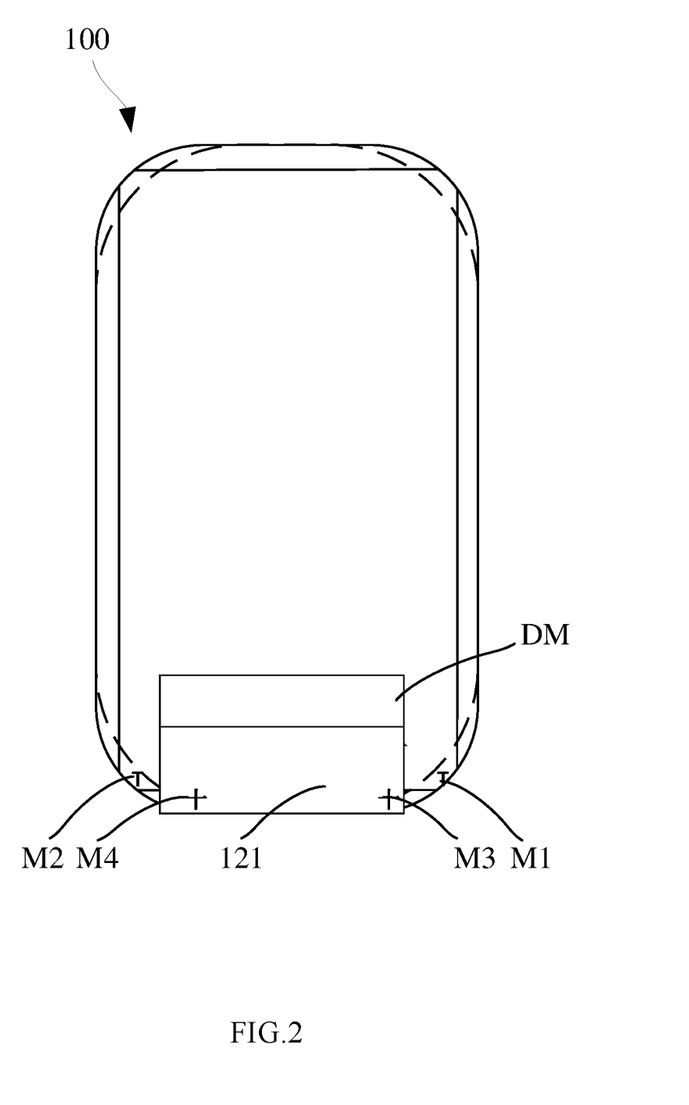
FIG. 2 is a schematic view of a back of the display device of FIG. 1.
Figure 3:
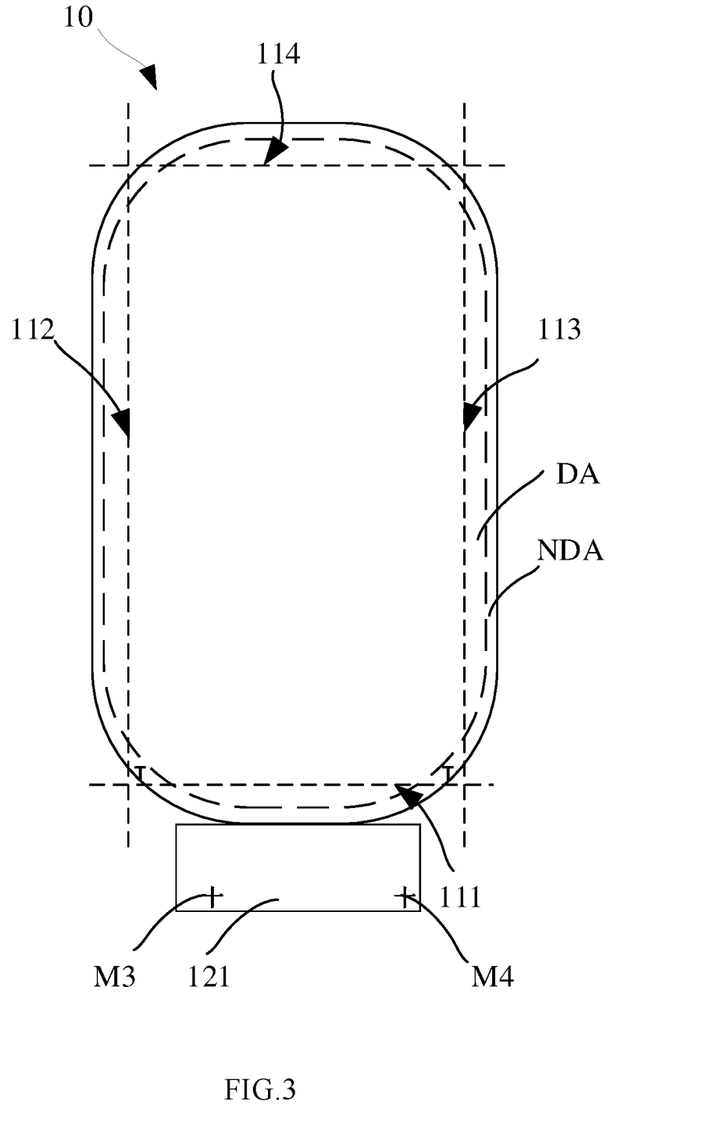
FIG. 3 is an expanded schematic view of a display panel of the display device of FIG. 1.

Please refer to FIG. 1 to FIG. 3. FIG. 1 a schematic top view of the display device according to a first embodiment of the present disclosure. FIG. 2 is a schematic view of a back of the display device of FIG. 1. FIG. 3 is an expanded schematic view of a display panel of the display device of FIG. 1.

The display device 100 is a four-curved surface screen display device. The display device 100 comprises a display panel 10. The display panel 10 of the present disclosure may be an organic light-emitting diode (OLED) display panel. The OLED display panel 10 may be one of an active matrix organic light-emitting diode (AMOLED) display panel, a passive matrix organic light-emitting diode (PMOLED) display panel, and a quantum dot organic light-emitting diode (QLED) display panel.

Figure 4:
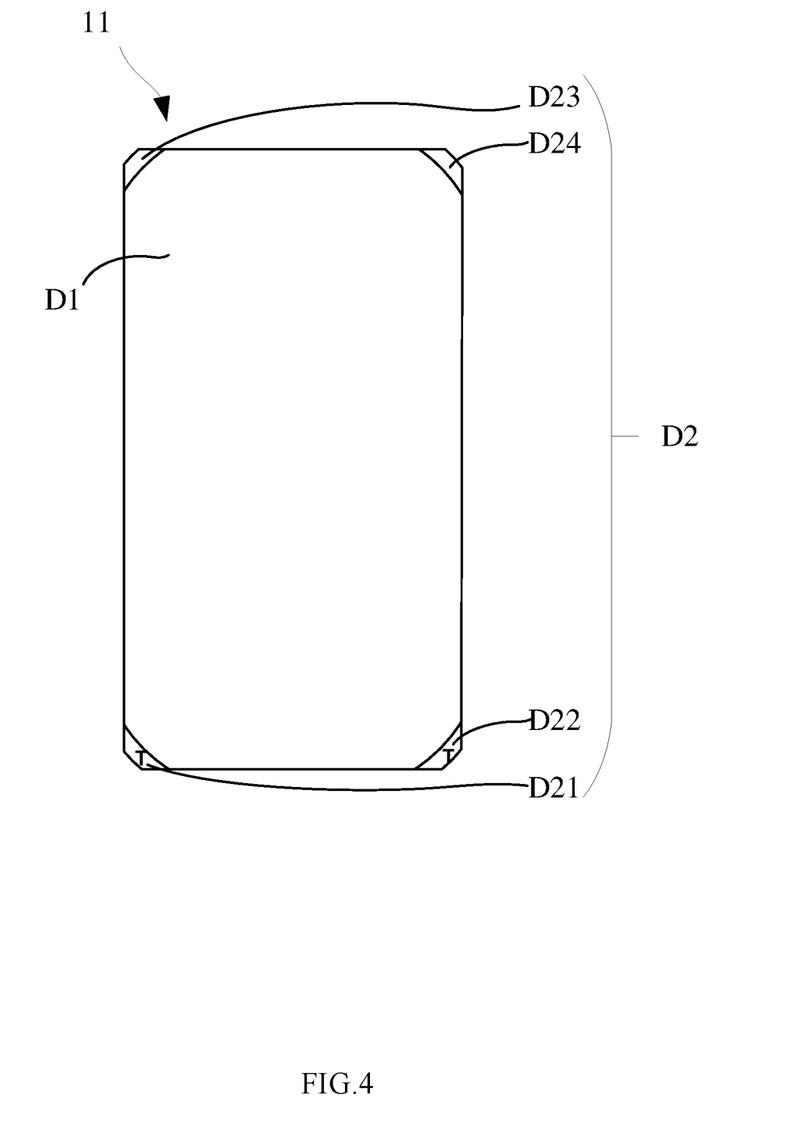
FIG. 4 is a top view of a planar area of FIG. 1.

The display panel 10 comprises a planar area 11. Please refer to FIG. 4, FIG. 4 is a top view of the planar area of FIG. 1. The planar area 11 comprises a main display area D1 and a peripheral area D2. The peripheral area D2 is located at four corners of the main display area D1. The main display area D1 is used to display pictures. The main display area D1 is an active area (AA). That is, a driving circuit and an organic light emitting device are provided in the main display area D1. The peripheral area D2 is a non-display area. The peripheral area D2 is used to set components such as wiring lines (not shown). The planar area 11 comprises a first edge 111, a second edge 112, a third edge 113, and a fourth edge 114. The first edge 111 is located between the second edge 112 and the third edge 113. That is, the first edge 111 is adjacent to the second edge 112 and the third edge 113, respectively. The fourth edge 114 is also located between the second edge 112 and the third edge 113. That is, the fourth edge 114 is also adjacent to the second edge 112 and the third edge 113, respectively. The first edge 111 is opposite the fourth edge 114. The second edge 112 is opposite the third edge 113. The display panel 10 further comprises a first bending area 12, a second bending area 13, a third bending area 14, and a fourth bending area 15. The first bending area 12 is connected to the first edge 111 and is bent toward a back of the display panel 10 with the first edge 111 as a bending axis. The second bending area 13 is connected to the second edge 112 and is bent toward the back of the display panel 10 with the second edge 112 as a bending axis. The third bending area 14 is connected to the third edge 113 and is bent toward the back of the display panel 10 with the third edge 113 as a bending axis. The fourth bending area 15 is connected to the fourth edge 114 and is bent toward the back of the display panel 10 with the fourth edge 114 as a bending axis. The first bending area 12, the second bending area 13, the third bending area 14, and the fourth bending area 15 are used for curved surface display. The first bending area 12, the second bending area 13, the third bending area 14, and the fourth bending area 15 may cooperate with the main display area D1 to display a complete picture. Each of the first bending area 12, the second bending area 13, the third bending area 14, and the fourth bending area 15 comprises a curved surface display area and a curved surface non-display area arranged around the curved surface display area. Specifically, an area within a dotted line in FIG. 1 is the display area, and an area outside the dotted line is the non-display area.

The first bending area 12 comprises a binding part 121. The binding part 121 is bent to the back of the display panel 10. The binding part 121 is used to bind a driving component DM. The driving component DM is used to input signals required by the display panel 10 into the display panel 10. Specifically, the binding part 121 is provided with a binding terminal. The binding terminals are bound with a chip on film (COF) or a flexible printed circuit (FPC), and one end of the COF or the FPC away from the binding terminals is connected with a printed circuit board (PCB). In the present embodiment, the first bending area 12 is located at a lower frame of the display device 100. That is, the driving component DM is bound to the lower frame of the display device 100. Moreover, the display device 100 merely comprises such one binding part 121 in the first bending area 12. In other embodiments, the binding part 121 may also be located at an upper frame, a left frame, or a right frame of the display device 100. The display device 100 may also comprise two or more binding parts 121, each of the binding parts 121 is bound to one driving component DM.

The peripheral area D2 comprises a first peripheral area D21 and a second peripheral area D22. The first peripheral area D21 is located at one corner of the main display area D1, and the first peripheral area D21 is located between the first bending area 12 and the second bending area 13. The second peripheral area D22 is located at one corner of the main display area D1, and the second peripheral area D22 is located between the first bending area 12 and the third bending area 14. The first peripheral area D21 and the second peripheral area D22 may be symmetrically arranged with respect to the main display area D1 in a direction of the first edge 111. It can be understood that the peripheral area D2 also comprises a third peripheral area D23 and a fourth peripheral area D24. The third peripheral area D23 is located at one corner of the main display area D1, and the third peripheral area D23 is located between the first bending area 12 and the fourth bending area 15. The fourth peripheral area D24 is located at one corner of the main display area D1 and the fourth peripheral area D24 is located between the third bending area 14 and the fourth bending area 15. The third peripheral area D23 and the first peripheral area D21 are symmetrically arranged with respect to the main display area D1 in a direction of the second edge 112. The fourth peripheral area D24 and the second peripheral area D22 are symmetrically arranged with respect to the main display area D1 in a direction of the third edge 113. More specifically, the first peripheral area D21 is located at a left corner of a lower edge of the main display area D1, and the second peripheral area D2 is located at a right corner of the lower edge of the main display area D1. The third peripheral area D23 is located at a left corner of an upper edge of the main display area D1, and the fourth peripheral area D24 is located at a right corner of the upper edge of the main display area D1.

Please refer to FIG. 1 and FIG. 3 together. The display panel 10 comprises a display area DA and a frame area NDA. The display panel 10, under an expanded state of FIG. 3, is bent along the first edge 111 to the fourth edge 114 of the planar display area DA to form the planar area 11, the first bending area 12, and the second bending area 13, the third bending area 14, and the fourth bending area 15 of FIG. 1.

A first alignment mark M1 is provided in the first peripheral area D21. A second alignment mark M2 is provided in the second peripheral area D22. The first alignment mark M1 and the second alignment mark M2 may be symmetrically arranged. Both the first alignment mark M1 and the second alignment mark M2 are configured for alignment of the binding part 121 upon bending. Corresponding to the first alignment mark M1 and the second alignment mark M2, the binding part 121 is provided with a third alignment mark M3 and a fourth alignment mark M4. The third alignment mark M3 is located at one end of the binding part 121 close to the first alignment mark M1. The fourth alignment mark M4 is located at one end of the binding part 121 close to the second alignment mark M2. The third alignment mark M3 and the fourth alignment mark M4 may be arranged symmetrically. The first alignment mark M1 cooperates with the third alignment mark M3 to determine a bending position and a bending radian of one end of the binding part 121. The second alignment mark M2 and the fourth alignment mark M4 are used to determine a bending position and a bending radian of another end of the binding part 121. Specifically, in a bending process of bending the binding part 121 to the back of the display panel 10, i.e., in the pad bending process, the first alignment mark M1 and the third alignment mark M3, the second alignment mark M2 and the fourth alignment mark M4 are captured by a CCD camera to obtain a relative positional relationship of the two sets of the alignment marks. When the relative positional relationship of the two sets of alignment marks meets a preset condition, it is determined that the binding part 121 is bent in place. Otherwise, it is determined that the binding part 121 is not bent in place. The present disclosure does not limit the shapes of the first alignment mark M1, the second alignment mark M2, the third alignment mark M3, and the fourth alignment mark M4. The shape of the first alignment mark M1, the second alignment mark M2, the third alignment mark M3, and the fourth alignment mark M4 may be a "T" shape, a "cross" shape, a "L" shape, or it may also be a hollow pattern or a raised pattern. In the present embodiment, the first alignment mark M1 and the second alignment mark M2 are "T" shapes. The third alignment mark M3 and the fourth alignment mark M4 are "cross" shapes. Specifically, in the bending process of bending the binding part 121 to the back of the display panel 10, i.e., during the pad bending process, the CCD camera is used to capture the first alignment mark M1 with the "T" shape and the third alignment mark M3 with the "cross" shape, the second alignment mark M2 with the "T" shape and the fourth alignment mark M4 with the "cross" shape. A linear distance between the first alignment mark M1 and the third alignment mark M3, and a linear distance between the second alignment mark M2 and the fourth alignment mark M4 are captured. If the linear distance between the first alignment mark M1 and the third alignment mark M3 and the linear distance between the second alignment mark M2 and the fourth alignment mark M4 are within a standard range, it is determined that the binding part 121 is bent in place. Otherwise, it is determined that the binding part 121 is not bent in place. A standard range may be 3 mm±0.2 mm.

The first alignment mark M1 and the second alignment mark M2 of the present disclosure are provided on the planar area 11 of the display panel 10, which will not be distorted, and are easier to be captured by a CCD camera and easy to be identified. In addition, the first alignment mark M1 and the second alignment mark M2 are provided in the peripheral area D2 of the planar area 11. If the first alignment mark M1 and the second alignment mark M2 are provided in the main display area D1, since a pixel structure in the main display area D1 is complex, a great number reflective metal structures exist. When these reflective metal structures are captured by the CCD camera, it is easy to reflect light, which is bad for capturing the alignment mark. Moreover, in the high-resolution display panel 10, adjacent pixels are densely arranged, and there is no space for providing the alignment marks. If the alignment marks are provided, a pitch between adjacent pixels needs to be increased, which is bad for achieving high-resolution display. Therefore, in the present disclosure, the first alignment mark M1 and the second alignment mark M2 are provided in the peripheral area D2, which does not affect a display effect, is convenient for the CCD camera to capture, and may increase a production rate.

The first alignment mark M1 may be located on one edge of the first peripheral area D21 away from the main display area D1. Further, the first alignment mark M1 is provided along an outer periphery of the first peripheral area D21. The second alignment mark M2 is located on one edge of the second peripheral area D22 away from the main display area D1. Further, the second alignment mark M2 is provided along an outer periphery of the second peripheral area D22. The first peripheral area D21 of the present disclosure is used to dispose the first alignment mark M1, the second peripheral area D22 is used to dispose the second alignment mark M2. Disposing the first alignment mark M1 on one edge away from the main display area D1 may compress an area of the first peripheral area D21 and increase an area of the main display area D1 of the planar area 11, thereby increasing an occupied ratio of the screen and narrowing the frame. Similarly, disposing the second alignment mark M2 on one edge away from the main display area D1 man compress an area of the second peripheral area D22 and increase an area of the main display area D1 of the planar area 11, thereby increasing the occupied ratio of the screen and narrowing the frame.

Figure 5:
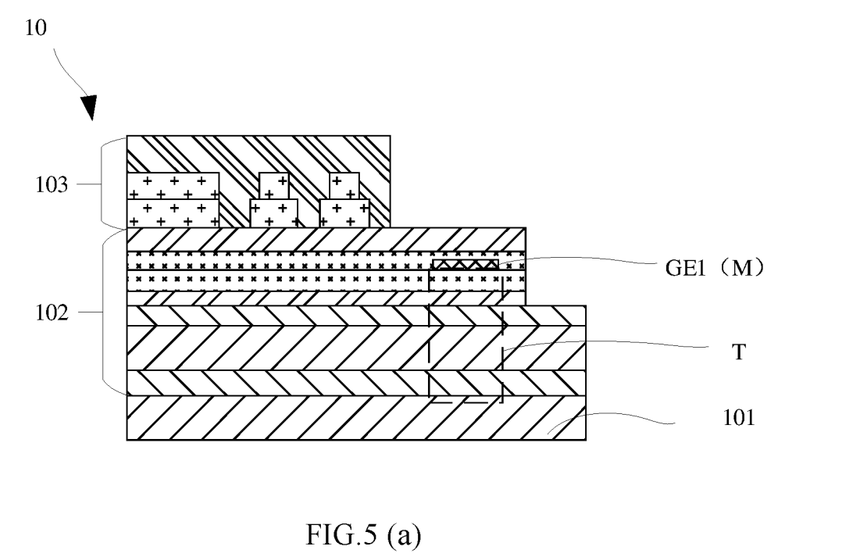

Please refer to FIG. 5 (a) to FIG. 5 (c). Materials of the first alignment mark M1 and the second alignment mark M2 may be metal materials or special reflective materials. In the present embodiment, in order to simplify the process, save materials, and reduce costs, the materials of the first alignment mark M1 and the second alignment mark M2 may be made of an original metal layer of the display panel 10. That is, the display panel 10 comprises a substrate 101 and a metal layer M. The metal layer M is disposed on the substrate 101. The metal layer M comprises a first alignment mark M1 and a second alignment mark M2. The first alignment mark M1 and the second alignment mark M2 may be disposed in the same metal layer, or may also be disposed in different metal layers. In addition, since the CCD camera captures the first alignment mark M1 from one edge of the substrate 101, in order to facilitate the CCD camera to capture the first alignment mark M1 and the substrate 101, a light transmission part T is provided between the first alignment mark M1 and the substrate 101. That is, a part between the first alignment mark M1 and the substrate 101 is entirely a transparent material layer, and no metal or other components with a light-shielding effect are provided.

Specifically, as shown in FIG. 5(a), the display panel 10 comprises a substrate 101, a driving circuit layer 102, and a light emitting layer 103.

The substrate 101 is a flexible substrate 101. The substrate 101 may comprises a single flexible organic layer, or may also comprise two or more flexible organic layers, and a barrier layer disposed between two adjacent flexible organic layers. A material of the flexible organic layer is selected from one or more of polyimide (PI), polyethylene naphthalate (PEN), polyethylene terephthalate (PET), polyarylate (PAR), polycarbonate (PC), polyetherimide (PEI), and polyethersulfone (PES). A material of the barrier layer is selected from one or more of inorganic materials such as silicon dioxide and silicon nitride.

The driving circuit layer 102 is disposed on the substrate 101. The driving circuit layer 102 comprises a driving circuit. The driving circuit may be a driving circuit commonly used in the art such as a 7T1C circuit or a 5T1C circuit. The driving circuit comprises a thin film transistor. Further, the driving circuit layer 102 comprises a gate metal layer, a source metal layer, and a drain metal layer. When the thin film transistor is a double gate thin film transistor, the gate metal layer may comprise a first gate metal layer GE1 and a second gate metal layer GE2.

The light emitting layer 103 is disposed on one edge of the driving circuit layer 102 away from the substrate 101. The light emitting layer 103 comprises a metal electrode layer. The light emitting layer 103 comprises an anode, a cathode, as well as a hole injection layer, a hole transport layer, an electron transport layer, an electron injection layer, and the like located between the anode and the cathode. The metal electrode layer may be an anode layer AL.

In the present embodiment, the metal layer M provided with the first alignment mark M1 and the second alignment mark M2 is the first gate metal layer GE1.

In another embodiment, as shown in FIG. 5(b), the metal layer M provided with the first alignment mark M1 and the second alignment mark M2 is the second gate metal layer GE2.

In yet another embodiment, as shown in FIG. 5(c), the metal layer M provided with the first alignment mark M1 and the second alignment mark M2 is the anode layer AL of the light emitting layer 103.

That is to say, the metal layer M provided with the first alignment mark M1 and the second alignment mark M2 may be one of the gate metal layer and the metal electrode layer.

Figure 6:
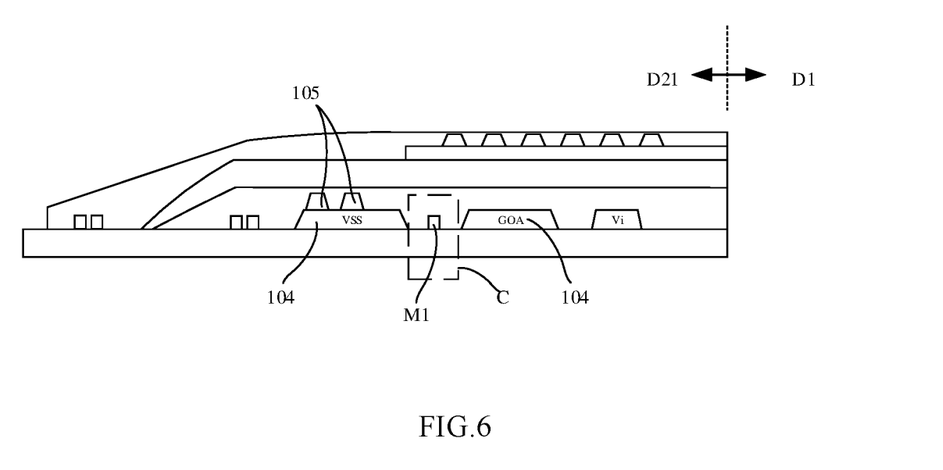
FIG. 6 is a schematic view of a partial cross-sectional structure of one embodiment of the display panel of FIG. 1.

Please refer to FIG. 6. FIG. 6 is a schematic view of a partial structure of one embodiment of the display panel of FIG. 1. The display panel 10 further comprises a plurality of signal wiring lines 104. A plurality of signal wiring lines 104 are in the first peripheral area D21. The first peripheral area D21 comprises a clearance area C. A plurality of signal wiring lines 104 are arranged around the clearance area C.

The clearance area C is an area where no signal wiring lines 104 is provided. The first alignment mark M1 is in the clearance area C. The signal wiring lines 104 may be GOA wiring lines, EM wiring lines, VSS wiring lines, Vi wiring lines, etc. By arranging the first alignment mark M1 between the multiple signal wiring lines 104, a space of the non-display area may be compressed. Moreover, the signal wiring lines 104 bypasses the first alignment mark M1 and is arranged to facilitate the capture of the CCD camera. Similarly, the plurality of signal wiring lines 104 are also provided in the second peripheral area D22. The second peripheral area D22 also comprises the clearance area C. The plurality of signal wiring lines 104 are arranged around the clearance area C. The second alignment mark M2 is in the clearance area C. The first peripheral area D21 comprises a retaining wall 105. The first alignment mark M1 may also be located between the retaining wall 105 and the main display area D1.

Figure 7:
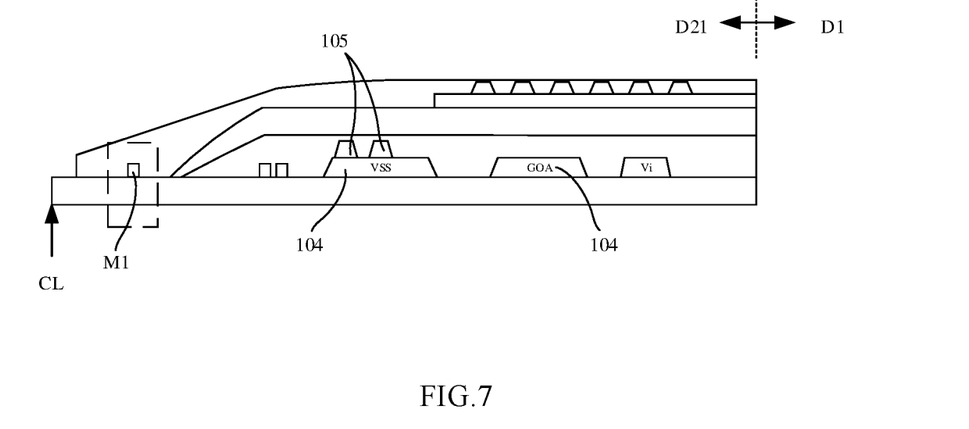
FIG. 7 is a schematic view of a partial cross-sectional structure of another embodiment of the display panel of FIG. 1.

Please refer to FIG. 7. FIG. 7 is a schematic view of a partial cross-sectional structure of another embodiment of the display panel of FIG. 1. An outer periphery of the first peripheral area D21 has a cutting path CL. The retaining wall 105 is located on one edge of the cutting path CL close to the main display area D1. The first alignment mark M1 is located between the retaining wall 105 and the cutting path CL. More specifically, the retaining wall 105 is located on one edge of the signal wiring lines 104 away from the main display area D1. In the present disclosure, the first alignment mark M1 is located between the retaining wall 105 and the cutting path CL. Since there is no signal wiring line 104 located between the retaining wall 105 and the cutting path CL, it facilitates to capture the alignment mark. The position of the second alignment mark M2 may refer to the first alignment mark M1, which will not be described here.

Please refer to FIG. 1 again. In the present embodiment, the four corners of the display device 100 form large, rounded corners. Specifically, the first bending area 12 and the second bending area 13 are spaced apart on two edges of the first peripheral area D21. The first bending area 12 and the second bending area 13 are spaced apart on two edges of the first peripheral area D21. That is, the first bending area 12 and the second bending area 13 do not intersect and are not connected. That is also to say that an intersection point of the first edge 111 and the second edge 112 is outside the planar area 11. Outer peripheries of the first bending area 12, the first peripheral area D21, and the second bending area 13 are connected to each other to form smooth, rounded corners. In addition, a curvature of the rounded corner is positive. Since the first bending area 12 and the second bending area 13 do not intersect and are not connected, when the flexible display panel 10 is bent to form a four-curved surface display screen, only a position of the first peripheral area D21 needs to be reserved. The flexible display panels 10 disposed at intervals on two edges of the first peripheral area D21 may be bent to form the first bending area 12 and the second bending area 13, respectively, and the manufacturing process is relatively simple.

Figure 8:
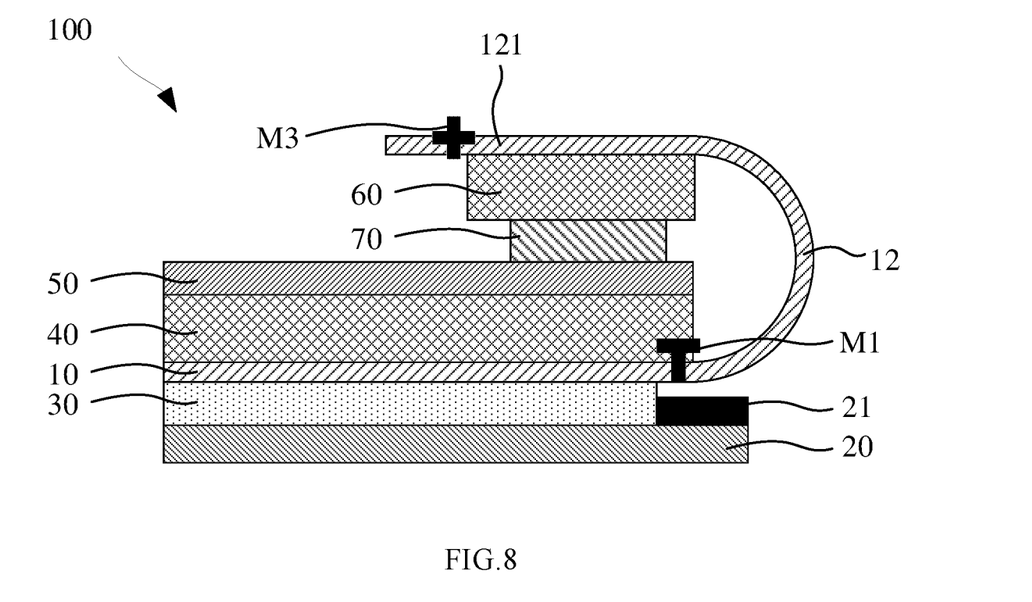
FIG. 8 is a schematic partial cross-sectional view of a pad bending process of the display device of FIG. 1.

In addition, please refer to FIG. 8. FIG. 8 is a schematic partial cross-sectional view of a pad bending process of the display device of FIG. 1. The display device 100 further comprises a cover plate 20. The cover plate 20 is located on one edge of the display panel 10. Specifically, the cover plate 20 is located on a front of the display panel 10. The cover plate 20 used for the four-curved surface display screen may use 2.5D glass. The cover plate 20 and the display panel 10 are bonded together by a transparent optical clear adhesive (OCA) 30. A light shielding layer 21 is provided on one edge of the cover plate 20 close to the display panel 10. The light shielding layer 21 is used to shield the first alignment mark M1 from light, so that the first alignment mark M1 is not noticed by a user. The light shielding layer 21 is provided corresponding to the first alignment mark M1. A material of the light shielding layer 21 may be black ink. An orthographic projection of the light shielding layer 21 on a plane where the first alignment mark M1 is located completely covers the first alignment mark M1. The light shielding layer 21 also corresponds to the second alignment mark M2, and an orthographic projection of the light shielding layer 21 projected on a plane where the second alignment mark M2 is located completely covers the second alignment mark M2, so that the second alignment mark M2 is not noticed by the user.

Hereinafter, an application of the first alignment mark M1, the second alignment mark M2, the third alignment mark M3, and the fourth alignment mark M4 in the pad bending process are described. The first bending area 12 of the display panel 10 is bent to the back of the display panel 10. One end of the first bending area 12 is a binding part 121. In addition, one edge of the display panel 10 away from the cover plate 20 is provided with a first back plate 40 for support. A reinforcing material is provided on one edge of the first back plate 40 away from the display panel 10. The binding part 121 is disposed opposite the display panel 10. One edge of the binding part 121 close to the display panel 10 is provided with a second back plate 60 for support. A heat dissipation layer 70 is further provided between the first back plate and the second back plate 60. During the pad bending process, the first alignment mark M1 on the front of the display panel 10 is always hidden by the light shielding layer 21 and is not noticed by the user. Since the first alignment mark M1 is in the planar area 11, it can be easily captured by the CCD camera on a back of the display panel 10. The CCD camera determines whether a predetermined bending position is reached by capturing a relative position relationship between the first alignment mark M1 and the third alignment mark M3. When it is determined that the predetermined bending position is reached, the bending process of the display panel 10 is stopped. Next, a binding process of the driving component DM is performed to complete the manufacture of the display device 100.

Figure 9:
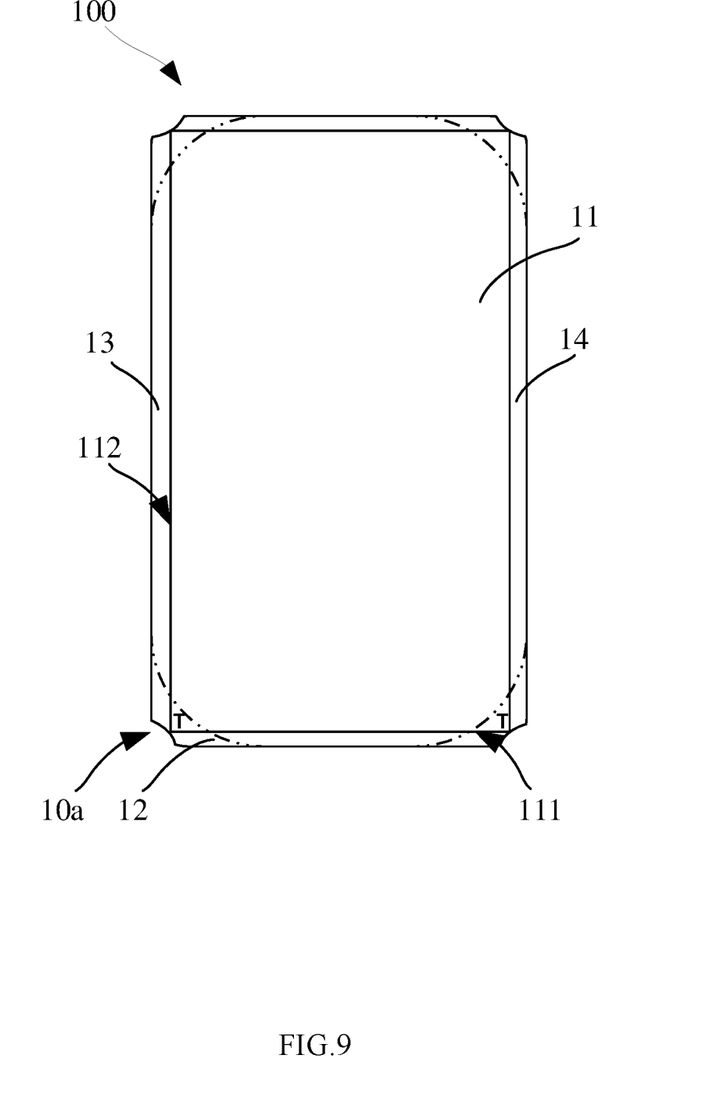
FIG. 9 is a schematic top view of the display device according to a second embodiment of the present disclosure.

Please refer to FIG. 9. FIG. 9 is a display device of the second embodiment of the present disclosure. A structure of the display device 100 of the second embodiment of the present disclosure is roughly the same as a structure of the display device 100 of the first embodiment. The difference between the display device 100 of the first embodiment and the display device 100 of the second embodiment is that four corners of the display device 100 form as a small, rounded corner. Specifically, the first bending area 12 and the second bending area 13 intersect. That is also to say that an intersection point of the first edge 111 and the second edge 112 is in a planar area 11. Since the first bending area 12 and the second bending area 13 intersect, when the flexible display panel 10 is bent to form a four-curved surface screen, an intersection position will be bent toward two directions at the same time, and wrinkles will occur. Therefore, an opening 10a is provided at the intersection point of the first bending area 12 and the second bending area 13, to prevent the intersection point of the first bending area 12 and the second bending area 13 from wrinkling, and a stress is transmitted to the first bending area 12 and the second bending area 13, thereby damaging the display panel 10. Since the opening 10a faces inward, i.e., the curvature of the small, rounded corner is negative.

The first bending area 12 and the third bending zone 14 intersect. That is also to say that an intersection point of the first edge 111 and the third edge 113 is in the planar area 11. Since the first bending area 12 and the third bending area 14 intersect, when the flexible display panel 10 is bent to form a four-curved surface screen, an intersection position will be bent toward two directions at the same time, and wrinkles will occur. Therefore, an opening 10a is also provided at the intersection point of the first bending area 12 and the third bending zone 14, to prevent the intersection point of the first bending area 12 and the third bending zone 14 from wrinkling, and a stress is transmitted to the first bending area 12 and the third bending area 14, thereby damaging the display panel 10.

Similar to the first embodiment, the first peripheral area D21 is located at one corner of the main display area D1, and the first peripheral area D21 is located between the first bending area 12 and the second bending area 13. The second peripheral area D22 is at one corner of the main display area D1, and the second peripheral area D22 is located between the first bending area 12 and the third bending area 14. A first alignment mark M1 is provided in the first peripheral area D21. A second alignment mark M2 is provided in the second peripheral area D22. Corresponding to the first alignment mark M1 and the second alignment mark M2, the binding part 121 is provided with a third alignment mark M3 and a fourth alignment mark M4. The first alignment mark M1 cooperates with the third alignment mark M3 to determine a bending position and a bending radian of one end of the binding part 121. The second alignment mark M2 and the fourth alignment mark M4 are used to determine a bending position and a bending radian of another end of the binding part 121.

The present disclosure provides a display device. The display device comprises a display panel comprising a planar area, a first bending area, and a second bending area. The planar area comprises a first edge and a second edge. The first edge is adjacent to the second edge. The planar area comprises a main display area and a peripheral area. The peripheral area is located at s corner of the main display area. The first bending area is connected to the first edge. The first bending area comprises a binding part. The binding part is bent to s back of the display panel. The second bending area is connected to the second edge. The peripheral area comprises a first peripheral area. The first peripheral area is located at s corner of the main display area, and the first peripheral area is located between the first bending area and the second bending area. A first alignment mark is provided in the first peripheral area. The first alignment mark is configured for alignment of the binding part upon bending. The first alignment mark of the present disclosure configured for alignment of the binding part upon bending is provided in the planar area. When the binding part is bent, distortion will not occur, and the first alignment mark is easy to be captured by the CCD camera and to be identified. In addition, the first alignment mark is provided in a non-display area of the planar area, and does not affect a pixel arrangement of the main display area, and is not interfered by a reflective metal of the main display area, so the first alignment is easy to be identified.

The above provides a detailed introduction to the implementation of the present disclosure, and specific examples are used herein to describe the principles and implementations of the present disclosure, and the description of the implementations above is merely used to help understand the present disclosure. Moreover, for those skilled in the art, according to the concept of the present disclosure, there will be changes in the specific embodiments and the scope of application. In summary, the content of the specification should not be construed as a limitation to the present disclosure.

What is claimed is:

1. A display device, comprising a display panel, wherein the display panel comprises:
   a planar area comprising a first edge and a second edge, wherein the first edge is adjacent to the second edge, the planar area comprises a main display area and a peripheral area, and the peripheral area is located at a corner of the main display area;
   a first bending area connected to the first edge, wherein the first bending area comprises a binding part, and the binding part is bent to a back of the display panel; and
   a second bending area connected to the second edge;
   wherein the peripheral area comprises a first peripheral area, the first peripheral area is located at the corner of the main display area, and the first peripheral area is located between the first bending area and the second bending area, a first alignment mark is provided in the first peripheral area, and the first alignment mark is configured for alignment of the binding part upon bending; and
   wherein the main display area further comprises a third edge opposite to the second edge and adjacent to the first edge, the display panel further comprises a third bending area connected to the third edge, the peripheral area comprises a second peripheral area located at the corner of the main display area and located between the first bending area and the third bending area, a second alignment mark is provided in the second peripheral area, and the second alignment mark is configured for alignment of the binding part upon bending.

2. The display device according to claim 1, wherein an intersection point of the first edge and the second edge is located outside the planar area.

3. The display device according to claim 2, wherein outer peripheries of the first bending area, the first peripheral area, and the second bending area are connected to each other to form a rounded corner.

4. The display device according to claim 1, wherein the intersection point of the first edge and the second edge is in the planar area.

5. The display device according to claim 4, wherein an opening is provided at an intersection point of the first bending area and the second bending area.

6. The display device according to claim 1, wherein the first alignment mark is located on one edge of the first peripheral area away from the main display area.

7. The display device according to claim 1, wherein the display panel comprises a substrate and a metal layer, the metal layer is disposed on the substrate, the metal layer comprises the first alignment mark, and a light transmission part is provided between the first alignment mark and the substrate.

8. The display device according to claim 7, wherein the display device comprises:
   the substrate;
   a driving circuit layer disposed on the substrate, wherein the driving circuit layer comprises a gate metal layer; and
   a light emitting layer disposed on one edge of the driving circuit layer away from the substrate, and the light emitting layer comprises a metal electrode layer;
   wherein the metal layer is one of the gate metal layer and the metal electrode layer.

9. The display device according to claim 1, wherein the display panel further comprises a plurality of signal wiring lines, the plurality of signal wiring lines are in the first peripheral area, the first peripheral area comprises a clearance area, the plurality of signal wiring lines are arranged around the clearance area, and the first alignment mark is in the clearance area.

10. The display device according to claim 1, wherein an outer periphery of the first peripheral area has a cutting path, the first peripheral area comprises a retaining wall, the retaining wall is located on one edge of the cutting path close to the main display area, and the first alignment mark is located between the retaining wall and the cutting path.

11. The display device according to claim 3, wherein a curvature of the rounded corner is positive.

12. The display device according to claim 1, wherein the first alignment mark and the second alignment mark are disposed in the same layer or disposed in different layers.

13. The display device according to claim 1, wherein the display panel further comprises a third alignment mark, and the third alignment mark is located at one end of the binding part close to the first alignment mark.

14. The display device according to claim 13, wherein a linear distance between the first alignment mark and the third alignment mark is within a range of 3 mm±0.2 mm.

15. The display device according to claim 1, wherein the display panel further comprises a fourth alignment mark, and the fourth alignment mark is located at one end of the binding part close to the second alignment mark.

16. The display device according to claim 15, wherein a linear distance between the second alignment mark and the fourth alignment mark is within a range of 3 mm±0.2 mm.

17. The display device according to claim 1, wherein the display device further comprises a cover plate, the cover plate is disposed on one edge of the display panel, a light shielding layer is provided on one edge of the cover plate close to the display panel, and the light shielding layer is disposed corresponding to the first alignment mark.

18. The display device according to claim 1, wherein the first alignment mark is a "T" shape, a "cross" shape or a "L" shape.

19. The display device according to claim 13, wherein the third alignment mark is configured to cooperate with the first alignment mark for alignment of the binding part upon bending, and the first alignment mark is misaligned from the third alignment mark along an extending direction of the second edge.

20. The display device according to claim 15, wherein the fourth alignment mark is configured to cooperate with the second alignment mark for alignment of the binding part upon bending, and the second alignment mark is misaligned from the fourth alignment mark along an extending direction of the second edge.

* * * * *